US006972632B2

United States Patent
Akahori

(10) Patent No.: US 6,972,632 B2
(45) Date of Patent: Dec. 6, 2005

(54) APPARATUS FOR CONTROLLING THE FREQUENCY OF RECEIVED SIGNALS TO A PREDETERMINED FREQUENCY

(75) Inventor: Hiroji Akahori, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 79 days.

(21) Appl. No.: 10/712,055

(22) Filed: Nov. 14, 2003

(65) Prior Publication Data
US 2004/0100331 A1  May 27, 2004

(30) Foreign Application Priority Data
Nov. 26, 2002  (JP) ............................. 2002-341601

(51) Int. Cl.[7] .............................................. H03L 7/00
(52) U.S. Cl. ......................................... 331/10; 331/11
(58) Field of Search ........................... 331/10, 11, 1 A, 331/17, 25; 327/147, 156, 161–163; 375/239, 375/354, 375, 376

(56) References Cited

U.S. PATENT DOCUMENTS 6,097,768 A * 8/2000 Janesch et al. ............. 375/330
6,665,355 B1 * 12/2003 Chen et al. ................. 375/321

FOREIGN PATENT DOCUMENTS

JP          9-186731         7/1997

\* cited by examiner

Primary Examiner—Linh My Nguyen
(74) Attorney, Agent, or Firm—Volentine Francos & Whitt, PLLC

(57) ABSTRACT

An automatic frequency controller restores symbols carried on a received signal by a data converter, and uses an in-phase and a quadrature component obtained by phase measurement from the symbol restored by the data converter to calculate first and second phase errors. The first and second phase errors are summed together by an adder to produce a phase error of a waveform more moderate than the first phase error to decrease and increase error correction in the ranges of smaller and larger phase errors, respectively, to elongate a period of positive amplitude to expand the desired range of polarity of the phase error. A multiplier multiplies the result from the summation with a coefficient to normalize it. An integrator integrates the normalized data to produce a control signal for use in restoring the symbols.

9 Claims, 4 Drawing Sheets

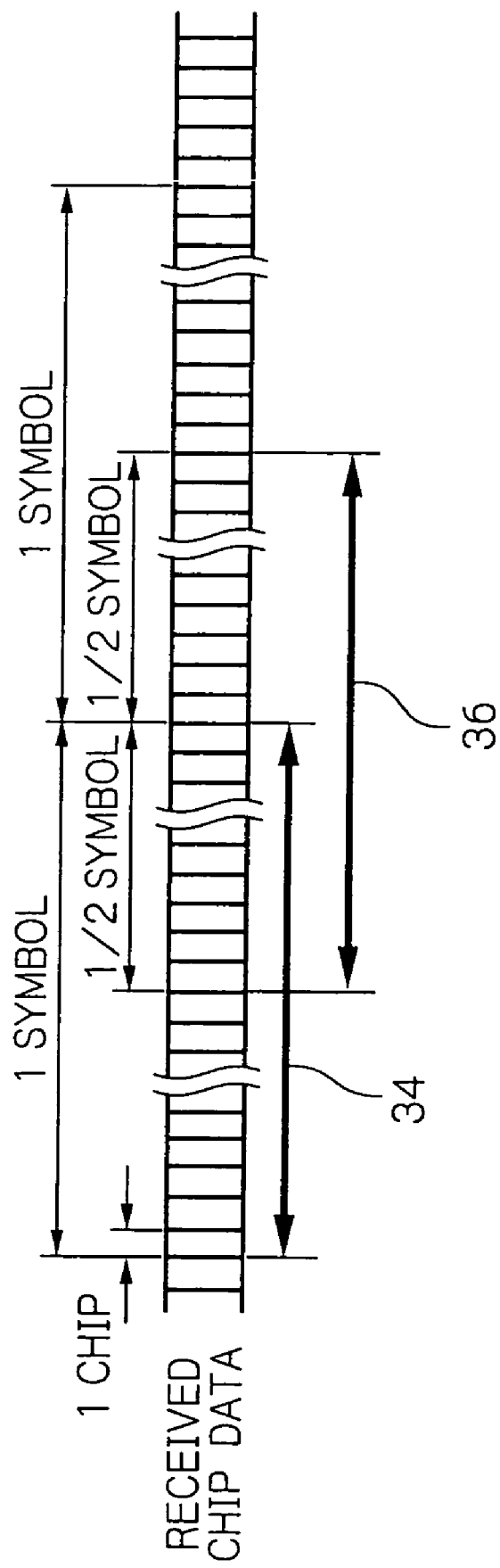

APPARATUS FOR CONTROLLING THE FREQUENCY OF RECEIVED SIGNALS TO A PREDETERMINED FREQUENCY

BACKGROUND OF THE INVENTION

1. Field of the Invention

This invention relates to a frequency controlling apparatus and, more particularly, to an automatic frequency controller (AFC) for automatically controlling the frequency in a received signal to a predetermined frequency.

2. Description of the Background Art

In receivers for achieving stable reception of signals, an automatic frequency controller (AFC) is used. The automatic frequency controller will now briefly be described. In the receiver, waves received with an antenna are sent to an input port of a mixer, to the other input port of which a carrier wave is supplied from an oscillator, such as a voltage-controlled oscillator (VCO). The mixer down-converts the frequency of the received wave with carrier wave synchronization to an intermediate frequency or a baseband frequency to output the converted signal to an Automatic frequency controller. The mixer also has a quadrature demodulating function and outputs an in-phase component I and a quadrature component Q, respectively.

Since the major portion of the automatic frequency controller is made up by an analog circuit, difficulties are frequently met in connection with circuitry integration, such that compensation for chronological changes and adjustment are occasionally required later-on. Since the VCO is not economically meritorious in providing an inexpensive automatic frequency controller, a type of automatic frequency controller has also been proposed in which the VCO is omitted to provide an inexpensive circuit providing a stable adjustment-free operation (see Japanese Patent Laid-Open Publication No. 186731/1997).

A type of automatic frequency control established with digital processing will now briefly be described. The digital type of automatic frequency controller includes a data converter, a phase error calculator, a multiplier and an integrator. The data converter renders the values of received data constant to output the resulting data to the phase error calculating unit and to a signal processing unit following thereto. The data converter may be provided with an orthogonal demodulating function for demodulating the in-phase component I and the quadrature component Q. The phase error calculator finds out an error in the carrier wave, that is, a phase error of the carrier wave between two symbols. For finding out the phase error, the vector components $(I_1, Q_1)$ and $(I_2, Q_2)$ of the temporally successive symbol data are used.

It is assumed that the phase angles of the immediately preceding vector component and the current vector component are $\theta_1$ and $\theta_2$, respectively. The phase difference $\Delta$ is taken between these vector components, $\theta_1$ and $\theta_2$, that is, $\Delta = \theta_2 - \theta_1$. The amplitude of the symbol is assumed to be unity. From this relationship, the vector components are shown $I_1 = \cos\theta_1$, $Q_1 = \sin\theta_1$, $I_2 = \cos\theta_2$, $Q_2 = \sin\theta_2$, respectively. For a small value of the phase difference $\Delta$, an approximation $\Delta = \sin\Delta$ holds. Thus, the phase error calculator calculates a phase error, $\sin\Delta = Q_2 \times I_1 - I_2 \times Q_1$, as the addition theorem of the trigonometric function is applied. In the absence of a phase error, the vector represented by the symbol data is constant. The phase error calculator outputs the phase error to one input port of the multiplier. This phase error is multiplied with a prestored loop gain value supplied to the other input port of the multiplier to output the resulting product value to the integrator.

The integrator converts the result of integration into an analog signal, which will in turn output in the form of aliasing-free control voltage via a lowpass filter (LPF) to a transmitter. By bringing the frequency of the received signal into coincidence with the frequency in the receiver, the receiver performs correct modulation.

Meanwhile, there are three requirements in the implementation of the automatic frequency controller. First, if the carrier error, that is the phase error, is of a large magnitude, the signal supplied to the integrator has to be increased so as to realize prompt convergence. Second, when the phase error becomes smaller to approach to its converging state, the signal supplied to the integrator should be decreased so as to increase the stability of the AFC circuitry. This assures the stabilized frequency in the receiver. Third, the phase error that can converge needs to be larger.

Of these, the first and second requirements are presently coped with by time control of the loop gain, that is, by so-called sacrifice control. As for the third requirement, the currently possible converging range of the phase error expands between –180 and 180 angular degrees, while the phase error may not converge satisfactorily to a frequency range other than this range.

SUMMARY OF THE INVENTION

It is an object of the present invention to provide a frequency controlling apparatus which is able to meet the plural requirements in implementation more satisfactorily than is possible with the related art.

For accomplishing the above-stated object, the present invention provides a frequency control apparatus comprising a frequency converter for receiving a signal of a first frequency modulated with a symbol representing digital information and for mixing the received signal with a second frequency different from the first frequency to convert the first frequency to a third frequency lower than the first frequency, and an oscillator for oscillating the second frequency. The oscillator is controlled to generate the second frequency in response to a control signal generated on the basis of an output of the frequency converter. The frequency control apparatus further comprises a data converter for restoring the symbol supplied from the frequency converter in conformity with modulation by which the symbol is modulated to output restored data, a phase error operator for measuring the restored data to obtain an in-phase component and a quadrature component to the in-phase component. The phase error operator uses the components obtained to calculate a first phase error and a second phase error for the received signal. The frequency control apparatus further comprises an adder for summing the first and second phase errors, a first multiplier for multiplying the output of the adder with a first coefficient, and an integrator for integrating the results of the first multiplier to generate the control signal.

In the frequency controlling apparatus of the present invention, the data converter demodulates the symbol to its original form. The phase error operator uses the in-phase component and the quadrature component to generate the first and second phase errors from the symbol restored by the data converter. The so generated first and second phase errors are summed by the adder to provide a waveform of the phase error more moderate than in the case of control by the first phase error. This decreases or increases the error correction for a smaller or larger range of the phase error, respectively, while elongating the period of positive amplitude and expanding the desirable range of polarity of the phase error. The multiplier multiplies the result of addition with the first coefficient to normalize the desired range of polarity of the phase error. The integrator integrates the normalized results to output the integrated value to manage frequency control of the outside oscillator with optimum converging characteristics, thus contributing to the frequency control of a utility apparatus carrying the frequency controlling apparatus.

BRIEF DESCRIPTION OF THE DRAWINGS

The objects and features of the present invention will become more apparent from consideration of the following detailed description taken in conjunction with the accompanying drawings in which:

FIG. 4 is a diagram showing the timing relationship of symbols output by the despread converter of FIG. 3.

DESCRIPTION OF THE PREFERRED EMBODIMENTS

Figure 1:
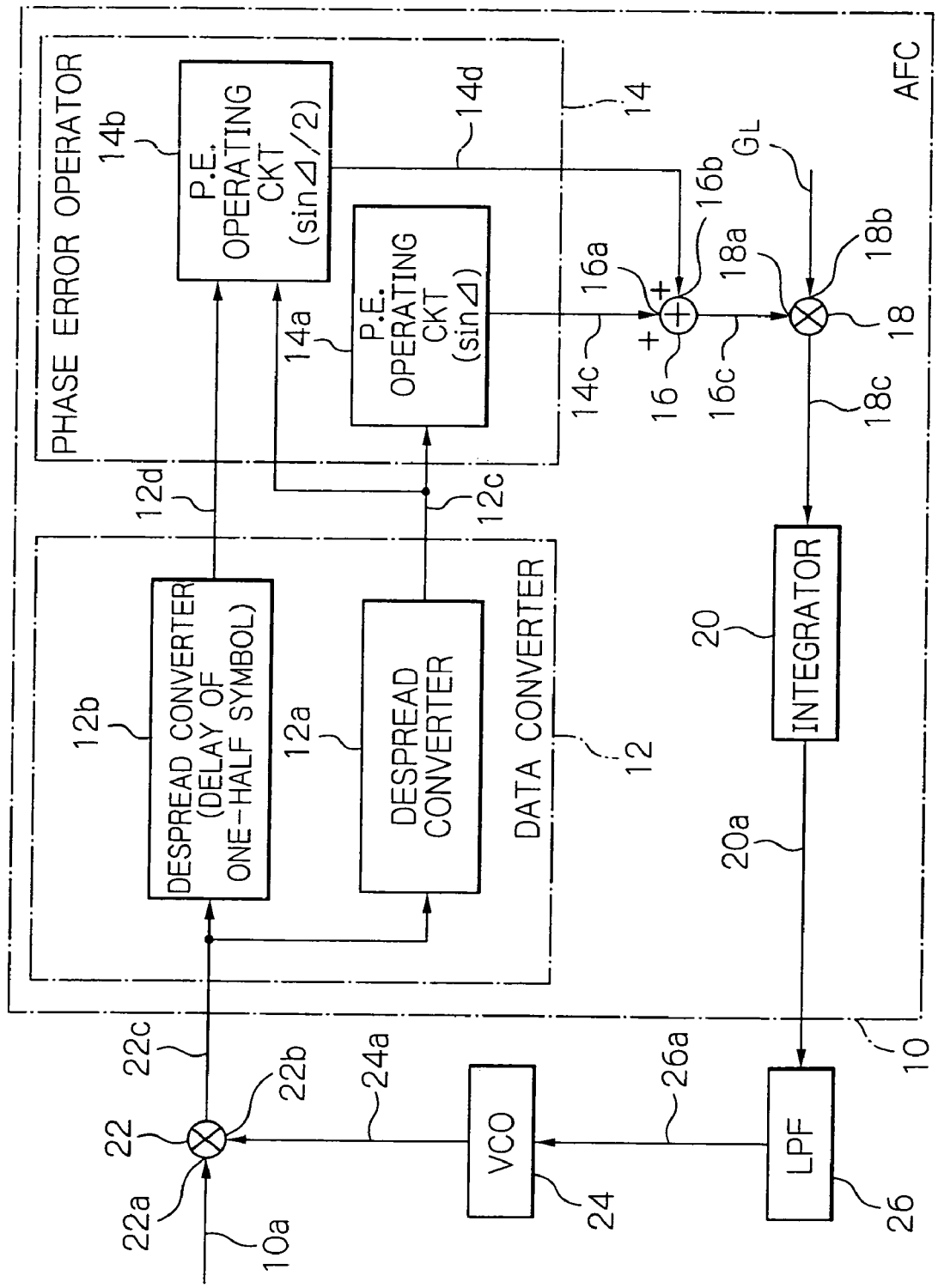
FIG. 1 is a schematic block diagram showing the configuration of an automatic frequency controller (AFC) to which the frequency controlling apparatus of the present invention is applied.

Referring to the accompanying drawings, preferred embodiments of the present invention will be described in detail. In the present embodiment, the frequency controlling apparatus of the present invention is applied to an automatic frequency controller (AFC) 10. The portions of the automatic frequency controller not directly relevant to understanding the present invention are not illustrated nor described. In the following description, a signal is designated with a reference numeral on which the signal appears.

Referring to FIG. 1, the automatic frequency controller 10 includes a data converter 12, a phase error operator 14, an adder 16, a multiplier 18 and an integrator 20 interconnected as shown. Outside the automatic frequency controller 10, there are provided a mixer 22, a voltage controller oscillator (VCO) 24 and a low pass filter (LPF) 26 interconnected as illustrated.

In the following, it is assumed for simplicity in explanation that there are no factors influencing the received wave, such as fading of the electrical wave or noise. The mixer 22A has its one input port 22a receiving a signal 10a received over an antenna, not shown, and its other port 22b receiving a carrier signal 24a, supplied from the VCO 24. The mixer 22 down-converts the received signal 10a into a signal 22c to route the latter to the automatic frequency controller 10.

The data converter 12 includes a pair of despread converters 12a and 12b. The despread converters 12a and 12b each include the function of applying a conversion inversely corresponding to the multiple access method used on the transmitter which the thus frequency-converted signal 22c comes from. The multiple access method may be exemplified by Time Division Multiple Access (TDMA) exploiting the nature of quadrature on the time axis, Frequency Division Multiple Access (FDMA) exploiting the nature of quadrature on the frequency axis or Code Division Multiple Access (CDMA). The conversion coping with any one of these methods is applied to the received signal 22c. The one despread converter 12a despread-converts the signal 22c to output a despread signal 12c of one symbol interval obtained to the phase error operator 14. The other despread converter 12b has the function of delaying the signal by a period equal to one-half symbol interval and despreading the delayed spread code to route a resultant, despread signal 12d of one symbol interval to the phase error operator 14.

The phase error operator 14 includes a pair of phase error (P. E.) operating circuits 14a and 14b. The phase error operating circuits 14a and 14b each include the function of measuring and calculating the phase error between symbols. The phase error operating circuits 14a and 14b are each provided with a memory, not shown, for temporary storing the phase components of respective symbols and some four-rule arithmetic function for the addition theorem for sinusoidal waves.

In the measurement of the phase error, a notation Δ denotes the phase error of the vector components, satisfying the relationship of $\theta_2 - \theta_1$, while the symbol data are $(I_1, Q_1)$ and $(I_2, Q_2)$, with the in-phase components $I_1 = \cos \theta_1$ and $I_2 = \cos \theta_2$ and with the quadrature components $Q_1 = \sin \theta_1$ and $Q_2 = \sin \theta_2$. When delayed as described above, the symbol data is $(I_h, Q_h)$. With the phase angle $\theta_h$ of this symbol data, the phase angle is written as $\theta_h = \theta_1 + \Delta/2$. In this case, the in-phase component and the quadrature component are $I_h = \cos \theta_h$ and $Q_h = \sin \theta_h$, respectively.

In the memory of the phase error calculating circuit 14a, there are stored a set of phase components $I_1 = \cos \theta_1$ and $Q_1 = \sin \theta_1$ for a phase $\theta_1$ presented by a directly previous, or immediately preceding, symbol and a set of phase components $I_2 = \cos \theta_2$ and $Q_2 = \sin \theta_2$ for a phase $\theta_2$ presented by the symbol supplied next. In the memory of the phase error operating circuit 14b, there are stored a set of phase components $I_1 = \cos \theta_1$ and $Q_1 = \sin \theta_1$ for the phase $\theta_1$ presented by a directly previous symbol and a set of phase components $I_h = \cos \theta_h$ and $Q_h = \sin \theta_h$ for the phase $\theta_h$ presented by the symbol supplied next.

Since the phase error Δ in the phase error operating circuit 14a represents the difference between the phase $\theta_2$ and the phase $\theta_1$, and the approximation for the phase error Δ=sin Δ for a small value of the phase error Δ, the phase error operating circuit 14a applies the four-rule arithmetic function to calculate the phase error sin Δ=sin $\theta_2$cos $\theta_1$−cos $\theta_2$sin $\theta_1 = Q_2 I_1 - I_2 Q_1$. Since the phase error Δ/2 in the phase error operating circuit 14b is equal to the difference between the phase $\theta_h$ and the phase $\theta_1$, that is $(\theta_h - \theta_1)$. The phase error operating circuit 14b uses the aforementioned approximation and applies the four-rule arithmetic function to calculate the phase error, sin(Δ/2)=sin $\theta_h$cos $\theta_1$−cos $\theta_h$sin $\theta_1 = Q_h I_1 - I_h Q_1$.

The phase error operating circuit 14a routes the generated phase error sin Δ (14c) to an input terminal 16a of the adder 16. The phase error operating circuit 14b outputs the generated phase error sin(Δ/2) (14d) to another input terminal 16b of the adder 16.

The adder 16 adds the phase error, sin Δ and the phase error, sin(Δ/2) together to output the resulting sum to the multiplier 18. This addition of the phase error, sin(Δ/2) to the phase error, sin Δ, yields a sum phase error 16c. The sum phase error 16c yields a period of amplitude larger than that of the phase error sin Δ so far used.

The multiplier 18 has the function of multiplying the sum phase error 16c with a loop gain $G_L$. The multiplier 18 includes an input terminal 18a, supplied with the sum phase error 16c, and another input terminal 18b, supplied with a loop gain $G_L$, prestored in and read out from a register, not shown. The multiplier 18 multiplies the sum phase error 16c with the loop gain $G_L$ to normalize the amplitude of the sum phase error 16c to unity, for example, to route the resulting data to the integrator 20. The loop gain $G_L$ is selected so as to yield a maximum value equal to unity. In the present embodiment, the loop gain $G_L$ is set to 0.5 because two of the amplitudes equal to each other are synthesized together. Consequently, output data 18c, indicating the result of multiplication, will be $\{\sin \Delta + \sin(\Delta/2)\}/2$.

The integrator 20 is made up of a digital-to-analog (D/A) converter for converting supplied digital signals to a corresponding analog signal. The integrator 20 converts the output data $\{\sin \Delta + \sin(\Delta/2)\}/2$ (18c) to a corresponding analog signal, which is then output to the lowpass filter (LPF) 26.

The lowpass filter 26 has the filtering function of cutting high frequency signal components contained in the analog signal 20a from the integrator 20 in order to remove the aliasing distortion. The lowpass filter 26 sends out an aliasing-free voltage control signal 26a to the VCO 24. The automatic frequency controller 10 applies the voltage control signal 26a through the integrator 20 and the lowpass filter 26 to the VCO 24 to manage feedback control of the oscillation frequency thereof. This VCO 24 routes an output signal to the mixer 22 as the carrier signal 24a, as described previously, to supply the frequency-stabilized signal 22c to the automatic frequency controller 10.

Although in the present embodiment the in-phase and quadrature components of the phase difference are measured by the phase error operator 14, the mixer 22 may be provided with the function of separating these components from each other.

Figure 2:
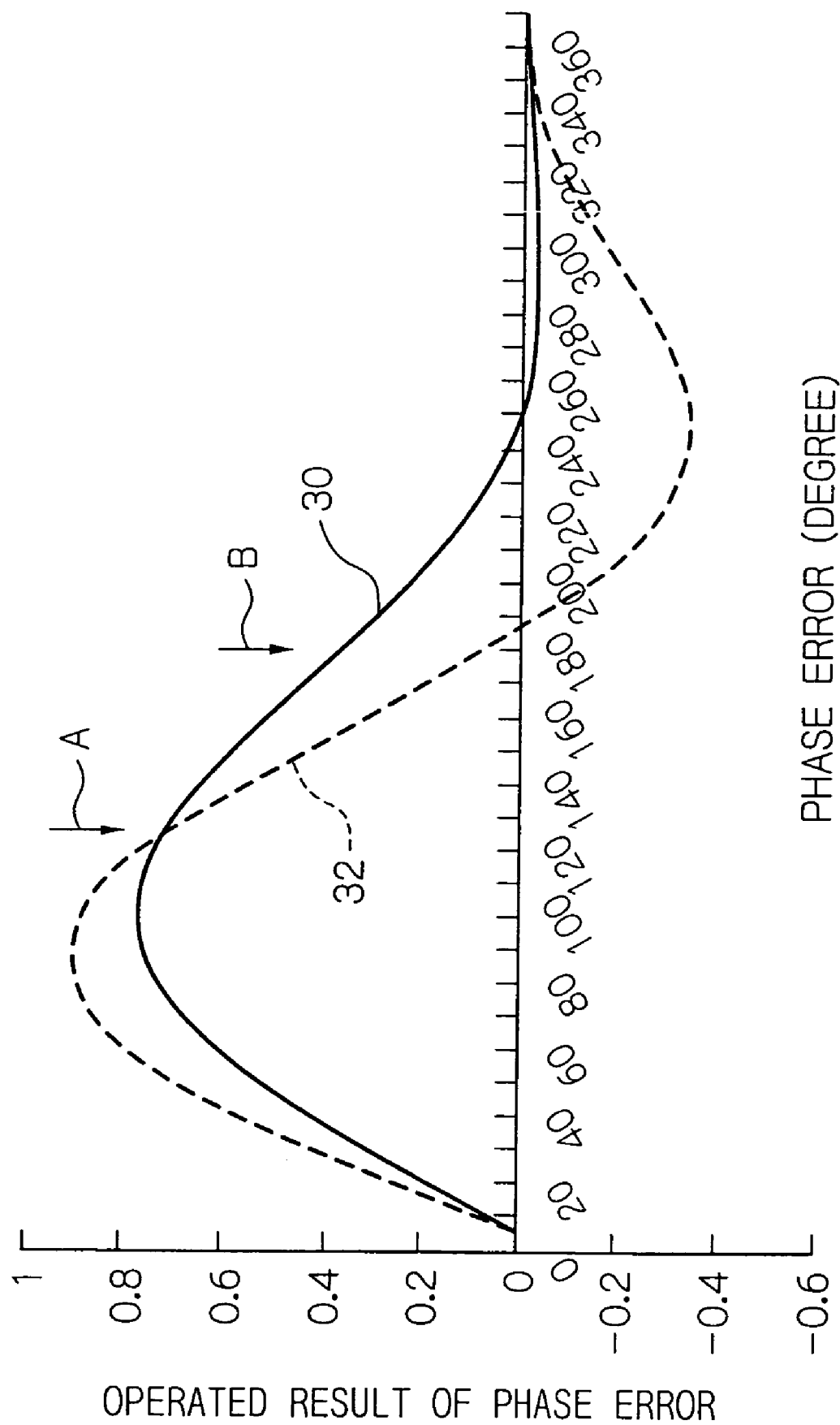
FIG. 2 is an illustrative diagram showing phase error operations, (sin Δ+sin Δ/2)/2 and phase error operations, sin Δ, respectively for the phase error Δ in the automatic frequency controller of FIG. 1.

Referring to FIGS. 1 and 2, the frequency control in the automatic frequency controller 10 will now be described. A solid curve 30 in FIG. 2 represents data, $\{\sin \Delta + \sin(\Delta/2)\}/2$ (18c), while a broken or dotted curve 32 in FIG. 2 represents data, $\sin \Delta$. Comparing these two curves with each other, the requirements for the automatic frequency controller 10 will be scrutinized. The solid curve 30 is more moderate than the broken curve 32, and also has its peak position shifted in the increasing direction of the phase error.

As the phase error increases beyond the value indicated by an arrow A corresponding to intersection of the two curves, the solid curve 30 will take on a value larger than that of the broken curve 32. This indicates that the data supplied to the integrator 20 is large in amplitude so that the frequency can converge more promptly than the broken curve 32. Additionally, the solid curve 30 assumes a value smaller than that of the curve 32 for the phase error smaller than the point indicated by the arrow A. This means that the data supplied to the integrator 20 is small and contributes more significantly to increasing the frequency stability than the broken curve 32.

The broken curve 32 reverses in polarity at or in the vicinity of the phase error of 180 degrees indicated by an arrow B. On the other hand, the solid curve 30 keeps the correct, or positive, polarity in excess of the phase error of 180 degrees, so that the polarity range of converging to the desired frequency can be broader than with $\sin \Delta$. Thus, it may be seen that the solid curve 30 has characteristics superior to those in the case of $\sin \Delta$ in terms of the three requirements referred to above.

Symbol values (amplitude) obtained from the data converter 12 after despread have chip data thereof rotated in phase when the carrier wave involves an error. When the chip data are supplied to the phase error operator 14 for calculation to add the two generated phase errors 14c and 14d together, the amplitudes of the two phase errors, corresponding to the results of addition (synthesis), cancel each other. Thus, the larger the phase error of the data for the calculated results 18c, the smaller the amplitude thereof, as may be seen from the curves in FIG. 2. With the phase error of 360 degrees, the amplitude becomes equal to zero. Thus, by synthesizing the changing symbol values, the results of calculations become smaller as the phase error increases.

By the above-described configuration, the automatic frequency controller 10 meets the totality of the requirements better than the case of using $\sin \Delta$, so that the characteristics obtained are superior to those obtained conventionally.

Figure 3:
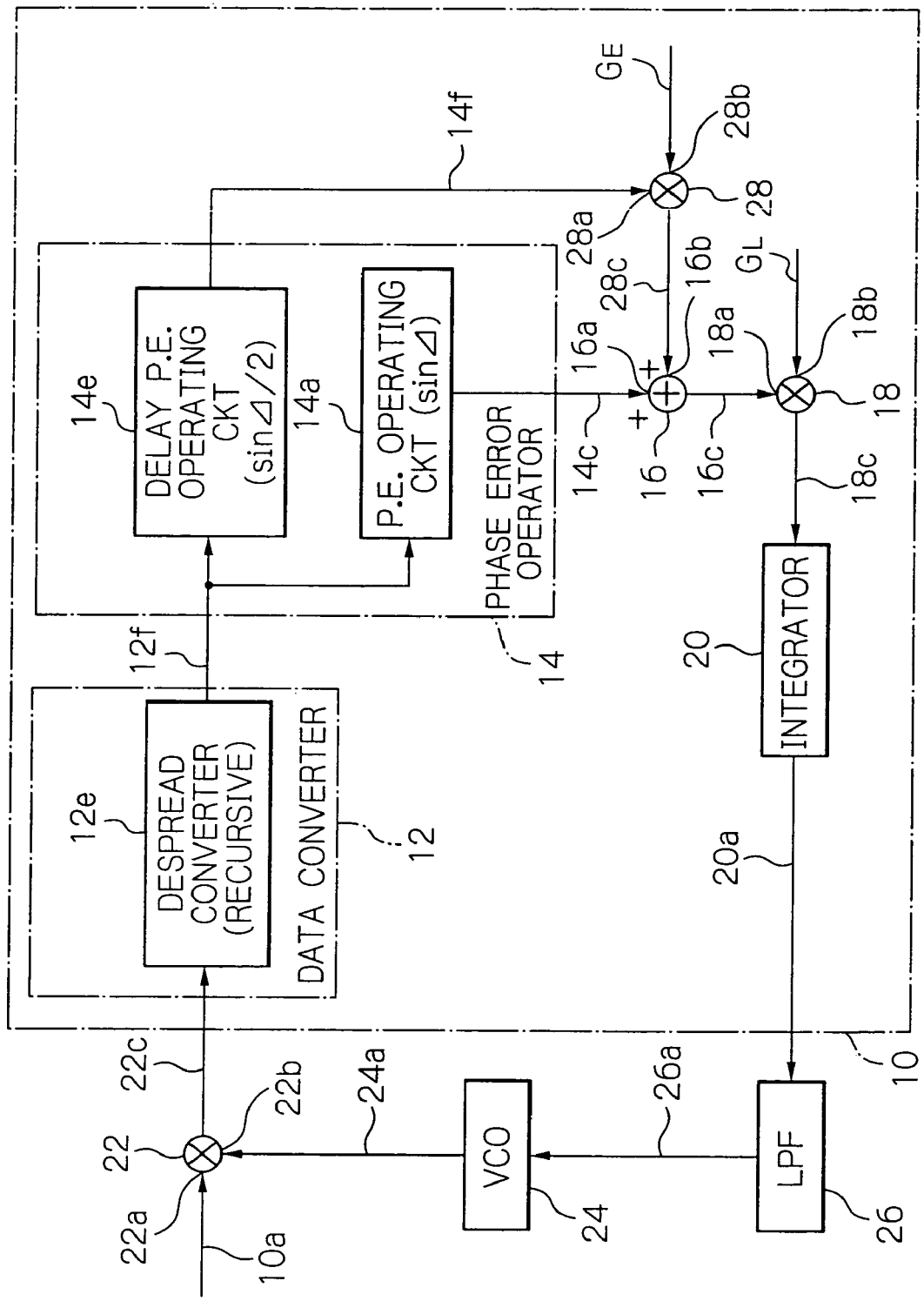
FIG. 3 is a schematic block diagram, like FIG. 1, showing the configuration of an alternative embodiment of the automatic frequency controller in FIG. 1.

Reference will now be made to FIG. 3 to describe an alternative embodiment of the automatic frequency controller 10. The parts or components common to those of the automatic frequency controller 10 of FIG. 1 are designated with the same reference numerals and the corresponding description will be omitted for simplicity. The connection topology of the automatic frequency controller 10 will only briefly be described.

The data converter 12 includes a despread converter 12e. The despread converter 12e has the function of despread-converting received chip data to output symbols at plural symbol timings to the phase error operator 14. The despread converter 12e performs the calculations for demodulation to generate recursive spread codes and output despread code (data) 34 with one symbol interval is produced, as done conventionally, as well as a despread code (data) 36 having one symbol interval and delayed by one-half symbol interval, as shown in FIG. 4. In order to perform the calculations, the despread converter 12e is controlled in timing by a control signal fed from a system controller in a manner not shown. The despread converter 12e thus outputs restored signals 12f at the two symbol timings to the phase error operator 14.

The phase error operator 14 includes a phase error operating circuit 14a and a delay phase error operating circuit 14e. These phase error operating circuits 14a and 14e are adapted for being supplied with the restored signals 12f and selecting the restored signals 12f with the respective input timings in a manner not shown. The phase error operating circuit 14a selectively captures on its input 12f the current symbol data and symbol data of the directly previous symbol, and uses the phase error information available from the two-symbol data to perform phase error calculations to develop the output, $\sin \Delta$. The phase error operating circuit 14a sends out $\sin \Delta$ (14c) to the input terminal 16a of the adder 16.

The delay phase error operating circuit 14e selectively captures symbol data of the current symbol and symbol data of the symbol preceding one-half symbol interval, and uses the phase error information available from the two pieces of data to perform phase error calculations to output data, $\sin(\Delta/2)$. The delay phase error operating circuit 14e routes the so generated $\sin(\Delta/2)$ (14f) to an input terminal 28a of a multiplier 28.

The multiplier 28 includes the function of multiplying the phase error 14f with an error gain $G_E$ of one-half symbol. The multiplier 28 is supplied with a phase error 14f on its one input terminal 28a and with an error gain value $G_E = \alpha$, on its other input terminal 28b, which gain value is stored in advance in a register, not shown, and readout from the register. The multiplier 28 multiplies the phase error 14f with the error gain a and routes the results of multiplication, $\alpha \cdot \sin(\Delta/2)$, (28c) to another input terminal 16b of the adder 16. This multiplication causes the ratio of the outputs from the two phase error calculations to be varied as desired.

The adder 16 sums the supplied signals 14c and 28c to each other to output a signal sin Δ+α·sin(Δ/2) as an output signal 16c to an input terminal 18a of the multiplier 18. The multiplier 18 multiplies sin Δ+α·sin(Δ/2) with the loop gain $G_L$ supplied on its other input terminal 18b to output the resulting product signal to the integrator 20. The loop gain $G_L$ is now set to 0.5 in the embodiment. By this multiplication, the output data 18c, corresponding to the results of multiplication, is {(sin Δ+α·sin(Δ/2)}/2. The integrator 20 converts the output data {sin Δ+α·sin(Δ/2)}/2 (18c) into an analog signal 20a, which is output to the lowpass filter 26. The lowpass filter 26 cuts high frequency signal components contained in the analog signal 20a received from the integrator 20 such as to remove the aliasing distortion. The lowpass filter 26 sends out an aliasing-free voltage control signal 26a to the VCO 24.

The automatic frequency controller 10 applies a voltage control signal 26a to the VCO through the integrator 20 and the lowpass filter 26 to feedback-control the oscillation frequency of the VCO 24. The VCO 24 routes its output signal to the mixer 22, as the carrier signal 24a, the frequency-stabilized signal being delivered to the automatic frequency controller 10.

With this configuration, the error gain $G_E$ is applied to the phase error obtained on calculations employing one-symbol data delayed by one-half symbol interval to vary the proportion of the phase error with respect to the phase error obtained on calculations using undelayed one-symbol data. In this manner, it is possible to perform frequency control adapted more flexibly to the controlling apparatus.

In the above-described alternative embodiment of the automatic frequency controller 10, the result of calculations is multiplied with the error gain $G_E$. A further alternative embodiment may, however, be adapted in which this multiplication is not performed. Specifically, the phase error operator 14 may be adapted to use two pieces of phase error information different by one symbol interval from each other and two pieces of phase error information different by one-half symbol interval from each other to calculate the respective phase errors therebetween, sum the phase errors, multiply the resultant sum by the loop gain to normalize it. With such an alternative embodiment also, frequency control may be achieved such as to attain the above-mentioned three advantages, namely, quicker frequency convergence than conventional, stable operation and extensive flexibility to phase errors.

The configuration described above uses the data restored by data conversion to sum the results from the usual phase error calculations and the phase error calculations on data shifted by one-half symbol interval to accomplish phase error calculations delayed from the period of the usual phase error calculations and multiply the so produced phase error by the loop gain $G_L$ to normalize the amplitude. It is possible in this manner to provide the phase error which is smaller than with the usual phase error calculations, for a smaller phase error range, and which is larger than with the usual phase error calculations, for a larger phase error range. Thus, the automatic frequency controller 10 helps realize frequency stability for the small phase error range, while enabling the frequency to converge promptly for the large phase error range.

Moreover, since the automatic frequency controller 10 increases the correct range of polarity of the phase error resultant from the phase error calculations, the desired frequency range to converge can be advantageously increased to provide for frequency control which enables the frequency to converge promptly and which assures stable operation and flexibility in coping with the phase error.

It should be noted that the phase error operator 14 uses two pieces of phase error information different by one symbol interval from each other and two pieces of phase error information different by one-half symbol interval from each other to calculate the respective phase errors, sum the so produced phase errors together and multiply the so produced sum with a loop gain to normalize it, thus rendering it possible to achieve frequency control such as to fit the aforementioned three needs, that is, quicker frequency convergence, stabler operation and more extensive flexibility in coping with the phase error.

Moreover, by employing two pieces of phase error information different by one-half symbol interval from each other, and by multiplying the results of the phase error calculations with the error gain $G_E$, it is possible to change the proportion of the phase error delayed by one-half symbol interval with respect to the phase error resultant from calculation with undelayed one-symbol data. This allows for frequency control more amenable to the apparatus and more flexible adaptation.

The entire disclosure of Japanese patent application No. 2002-341601 filed on Nov. 26, 2002, including the specification, claims, accompanying drawings and abstract of the disclosure is incorporated herein by reference in its entirety.

While the present invention has been described with reference to the particular illustrative embodiments, it is not to be restricted by the embodiments. It is to be appreciated that those skilled in the art can change or modify the embodiments without departing from the scope and spirit of the present invention.

What is claimed is:

1. A frequency control apparatus comprising:
   a frequency converter for receiving a signal of a first frequency modulated with a symbol representing digital information and for mixing the received signal with a second frequency different from the first frequency to convert the first frequency to a third frequency lower than the first frequency;
   an oscillator for oscillating the second frequency, said oscillator being controlled to generate the second frequency in response to a control signal generated on a basis of an output of said frequency converter;
   a data converter for restoring the symbol supplied from said frequency converter in conformity with modulation by which the symbol is modulated to output restored data;
   a phase error operator for measuring the restored data to obtain an in-phase component and a quadrature component to the in-phase component, and using the components obtained to calculate a first phase error and a second phase error for the received signal;
   an adder for summing the first and second phase errors;
   a first multiplier for multiplying an output of said adder with a first coefficient; and
   an integrator for integrating results of said first multiplier to generate the control signal.

2. The apparatus in accordance with claim 1, wherein said data converter comprises:
   a first data converter for restoring the symbol supplied from said frequency converter in conformity with the modulation by which the symbol is modulated; and
   a second data converter for delaying the symbol supplied from said frequency converter and for restoring the symbol in conformity with the modulation by which the delayed symbol is modulated.

3. The apparatus in accordance with claim 2, wherein said second data converter delays the supplied symbol by one-half symbol interval of the supplied symbol.

4. The apparatus in accordance with claim 2, wherein said phase error operator comprises:
 a first phase error operator for measuring two component signals obtained at one symbol interval of the restored data, and for using the two component signals to calculate a first phase error for the received signal; and
 a second phase error operator for measuring the two component signals and delayed two component signals and for using the two component signals and the delayed two component signals to calculate a second phase error for the received signal.

5. The apparatus in accordance claim 3, wherein said phase error calculator comprises:
 a first phase error operator for measuring two component signals obtained at one symbol interval of the restored data, and for using the two component signals to calculate a first phase error for the received signal; and
 a second phase error operator for measuring the two component signals and delayed two component signals and for using the two component signals and the delayed two component signals to calculate a second phase error for the received signal.

6. The apparatus in accordance with claim 1, wherein said data converter restores the supplied symbol in conformity with the modulation by which the symbol is modulated at a plurality of timings at which the symbols are available.

7. The apparatus in accordance with claim 5, wherein said data converter restores the supplied symbol in conformity with the modulation by which the symbol is modulated at a plurality of timings at which the symbols are available.

8. The apparatus in accordance with claim 6, wherein said phase error operator comprises:
 a first phase error operator for calculating the first phase error based on two pieces of phase information different by one symbol interval for the restored data; and
 a second phase error operator for calculating a second phase error between a first symbol and a second symbol following the first symbol by one-half symbol interval supplied as recursive spread codes.

9. The apparatus in accordance with claim 8, further comprising a second multiplier for multiplying the second phase error with a second coefficient for the second phase error to route a result from multiplication to said adder.

* * * * *